United States Patent
Nguyen

(10) Patent No.: US 6,813,742 B2
(45) Date of Patent: Nov. 2, 2004

(54) HIGH SPEED TURBO CODES DECODER FOR 3G USING PIPELINED SISO LOG-MAP DECODERS ARCHITECTURE

(75) Inventor: Quang Nguyen, Allentown, PA (US)

(73) Assignee: ICOMM Technologies, Inc., Wilmington, DE (US)

( * ) Notice: Subject to any disclaimer, the term of this patent is extended or adjusted under 35 U.S.C. 154(b) by 347 days.

(21) Appl. No.: 09/681,093

(22) Filed: Jan. 2, 2001

(65) Prior Publication Data

US 2002/0124227 A1 Sep. 5, 2002

(51) Int. Cl.⁷ ............................................. H03M 13/03
(52) U.S. Cl. ...................................... 714/794; 714/755
(58) Field of Search ............................... 714/755, 786; 375/341, 265

(56) References Cited

U.S. PATENT DOCUMENTS

| | | | |
|---|---|---|---|
| 5,406,570 A | 4/1995 | Berrou et al. ............... | 714/792 |
| 5,446,747 A | 8/1995 | Berrou ....................... | 714/788 |
| 5,563,897 A | 10/1996 | Pyndiah et al. ............. | 714/755 |
| 5,721,745 A | 2/1998 | Hladik et al. ............... | 714/755 |
| 6,000,054 A | 12/1999 | Bahr et al. .................. | 714/786 |
| 6,023,783 A | 2/2000 | Divsalar et al. ............ | 714/792 |
| 6,182,261 B1 * | 1/2001 | Haller et al. ................ | 714/758 |
| 6,307,901 B1 * | 10/2001 | Yu et al. ..................... | 375/341 |
| 6,516,437 B1 * | 2/2003 | Van Stralen et al. ........ | 714/755 |
| 6,526,539 B1 * | 2/2003 | Yano et al. .................. | 714/794 |

OTHER PUBLICATIONS

Montorsi et al., Desing of fixed–point iterative decoders for concatenated codes with interleavers, 2000, IEEE, p. 801–806.*

Chen et al., reduced state soft/input–soft/output algorithm for complexity reduction in iterative and non iterative data detection, 2000, IEEE, p. 6–10.*

Lee et al., Evaluation of the MAP decoder for the Turbo codes of IMT 2000, 2000, IEEE, p. 1266–1269.*

Ambroze et al., Iterative MAP decoding for serial concatenated convolutional codes, Apr. 1998, IEEE proc. Commun., vol. 145, No.2, p. 53–59.*

Dr. Woodard et al., Implementation of high rate turbo decoders for third genration mobile communications, 1999, IEEE, p. 12/1–12/6.*

Jeon et al., An efficeint Turbo decoder archietecture for IMT 2000, 1999, IEEE, p. 301–304.*

* cited by examiner

Primary Examiner—Albert Decady
Assistant Examiner—Shelly A Chase
(74) Attorney, Agent, or Firm—Sean L. Ingram; Mintz Levin Cohn Ferris Glovsky and Popeo P.C.

(57) ABSTRACT

A Bandband Processor for Wireless Communications is presented. The invention encompasses several improved Turbo codes method to provide a more practical and simpler method for implementation a Turbo Codes Decoder in ASIC or DSP coding. (1) A plurality of pipelined pipelined Log-MAP decoders are used for iterative decoding of received data. (2) In a pipeline mode, Decoder A decodes data from the De-interleaver RAM memory while the Decoder B decodes data from the De-interleaver RAM memory at the same time. (3) Log-MAP decoders are simpler to implement in ASIC with only Adder circuits, and are low-power consumption. (4) Pipelined Log-MAP decoders method provide high speed data throughput, one output per clock cycle.

8 Claims, 21 Drawing Sheets

Turbo Codes Decoder System Block Diagram

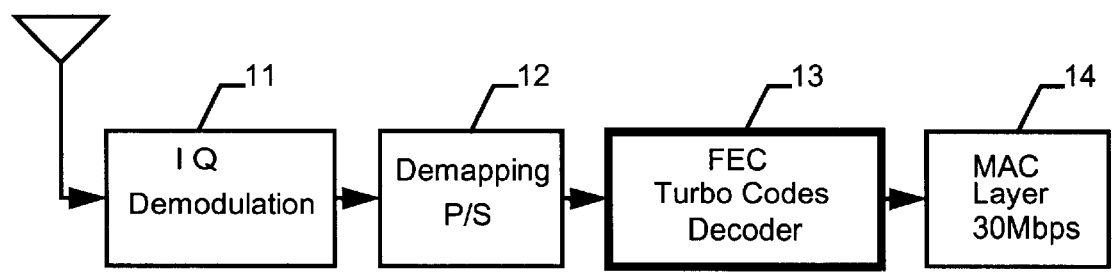
FIGURE 1. Typical 3G Receiver Functional Block Diagram, (Prior art)

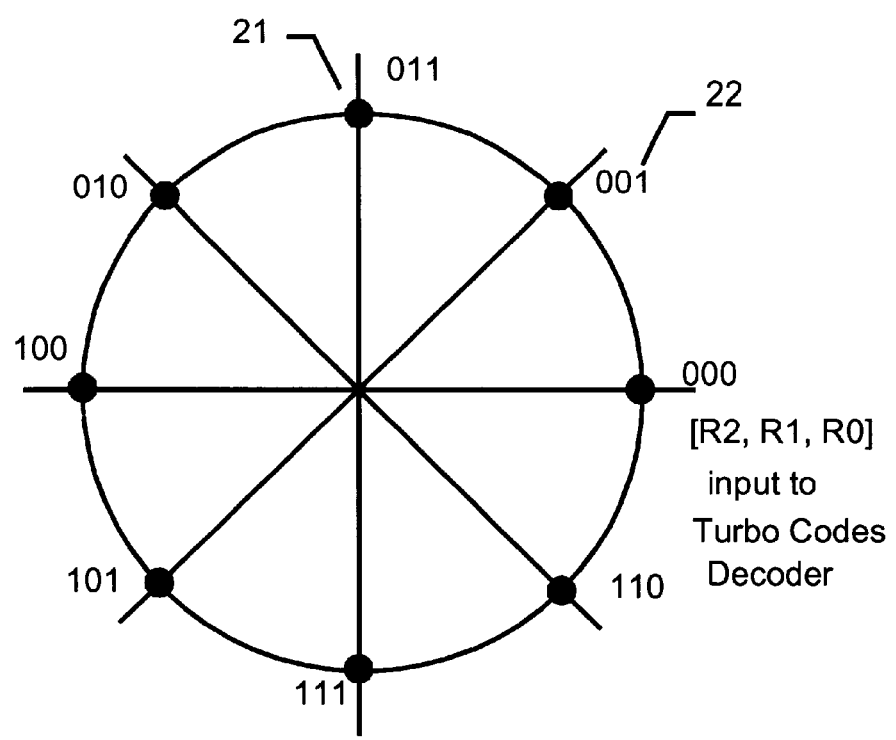
FIGURE 2. 8-PSK constellations, (Prior art)

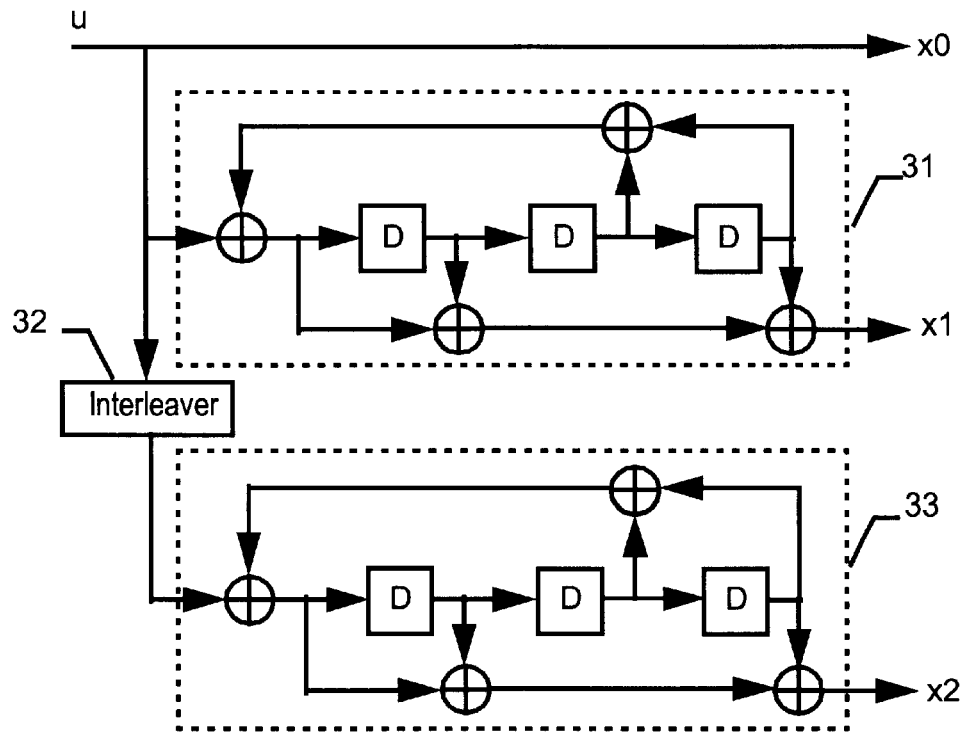
$$G(D) = [1, n(D) / d(D)]$$
where, $d(D) = 1 + D2 + D3, n(D) = 1 + D + D3$
FIGURE 3. The 8-states Parallel Concatenated Convolutional Code (PCCC)
(Prior art)

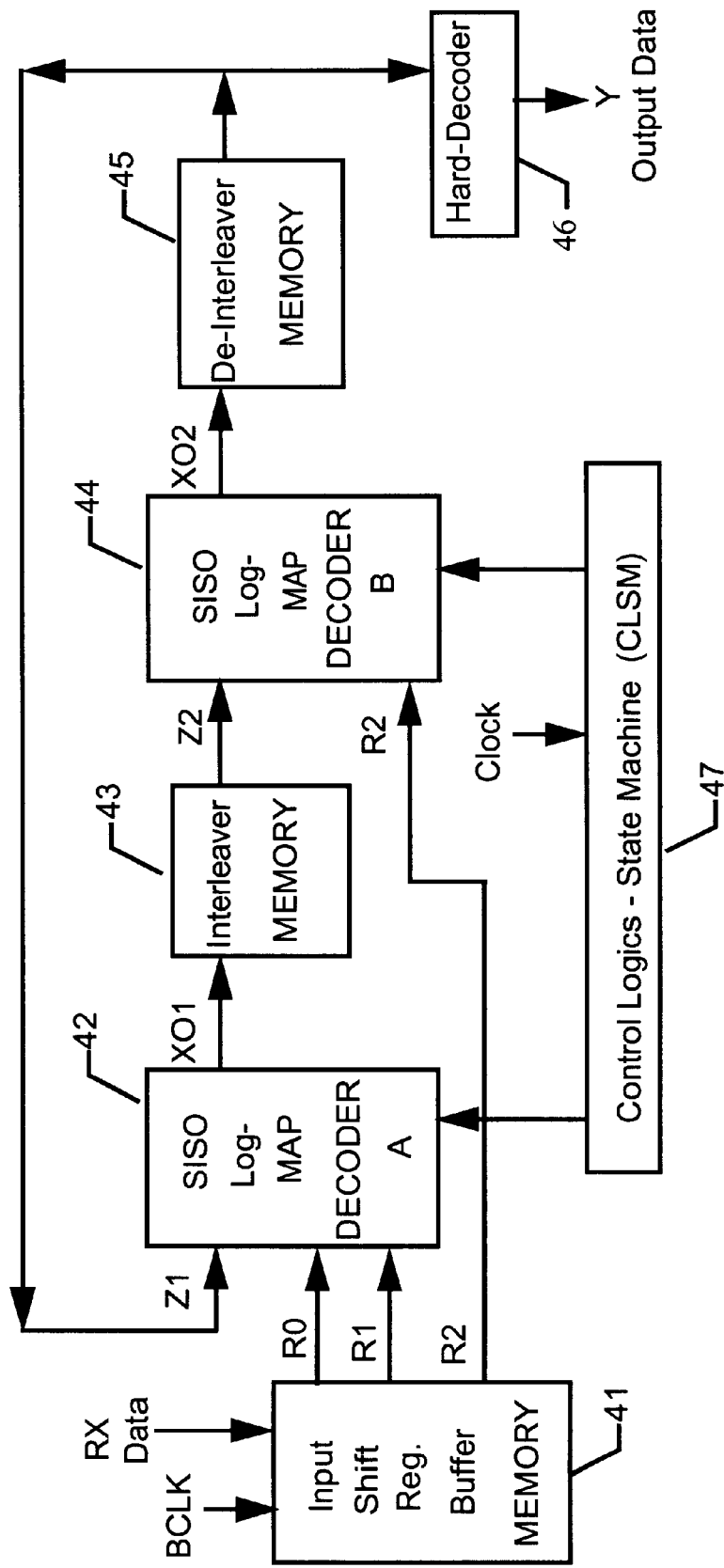
FIGURE 4. Turbo Codes Decoder System Block Diagram

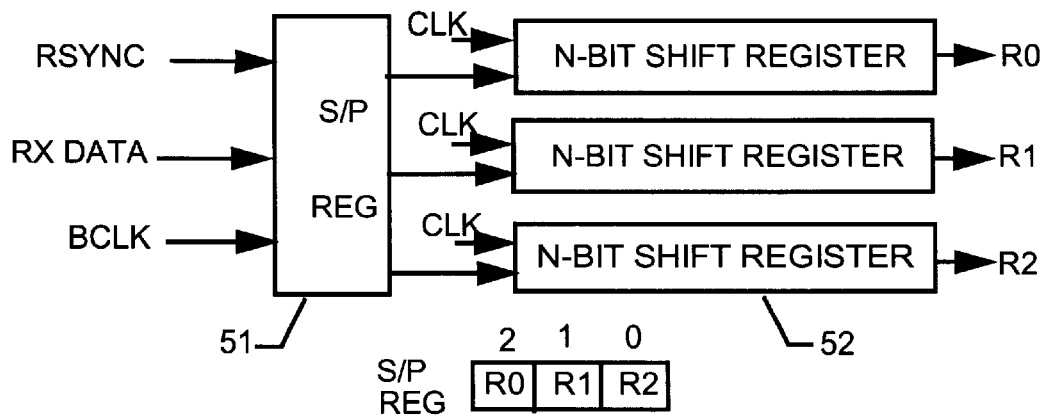
FIGURE 5. Input Buffer Shift Registers
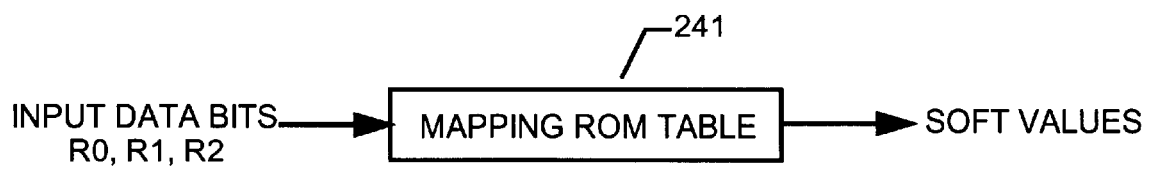
FIGURE 5b. Soft Values Mapping ROM Table
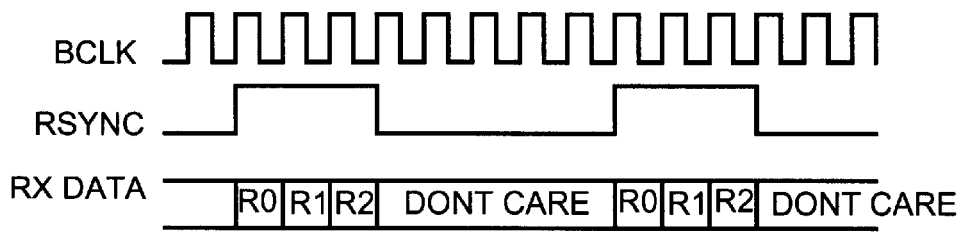
FIGURE 6. Input Buffer Interface Timing

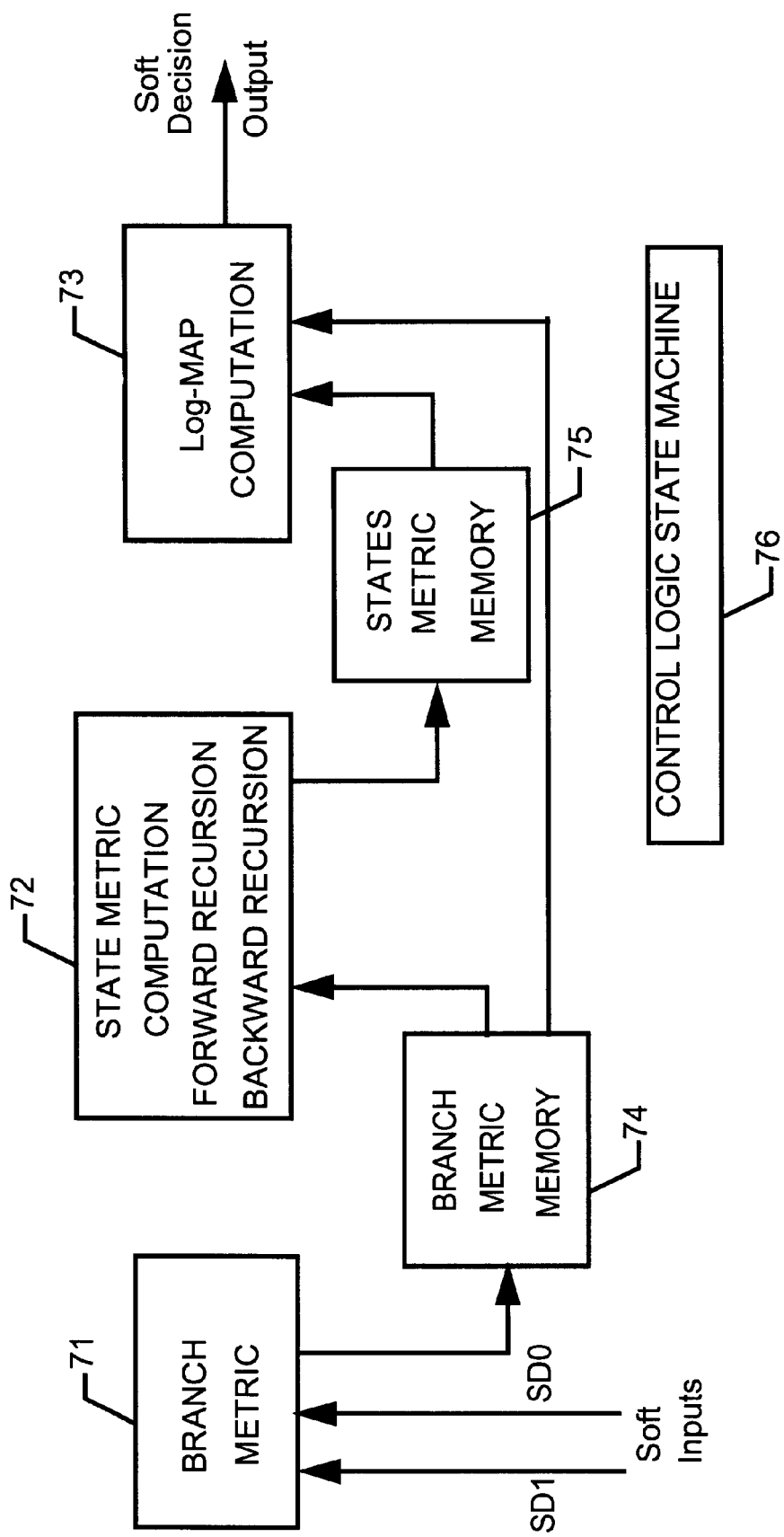
FIGURE 7. The 8-states SISO Log-MAP Decoder

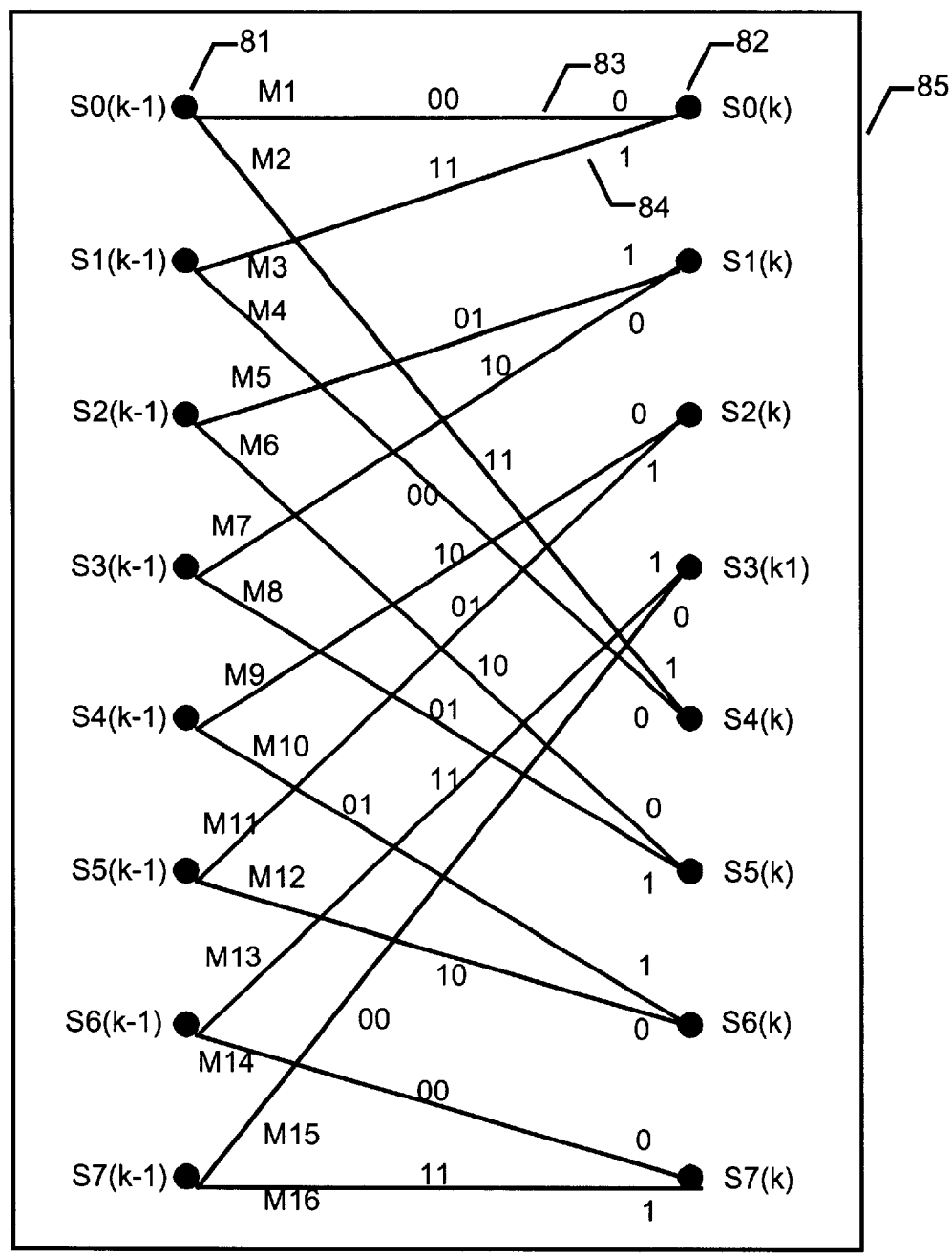
FIGURE 8. The 8-STATES TRELLIS DIAGRAM of a SISO Log-MAP Decoder

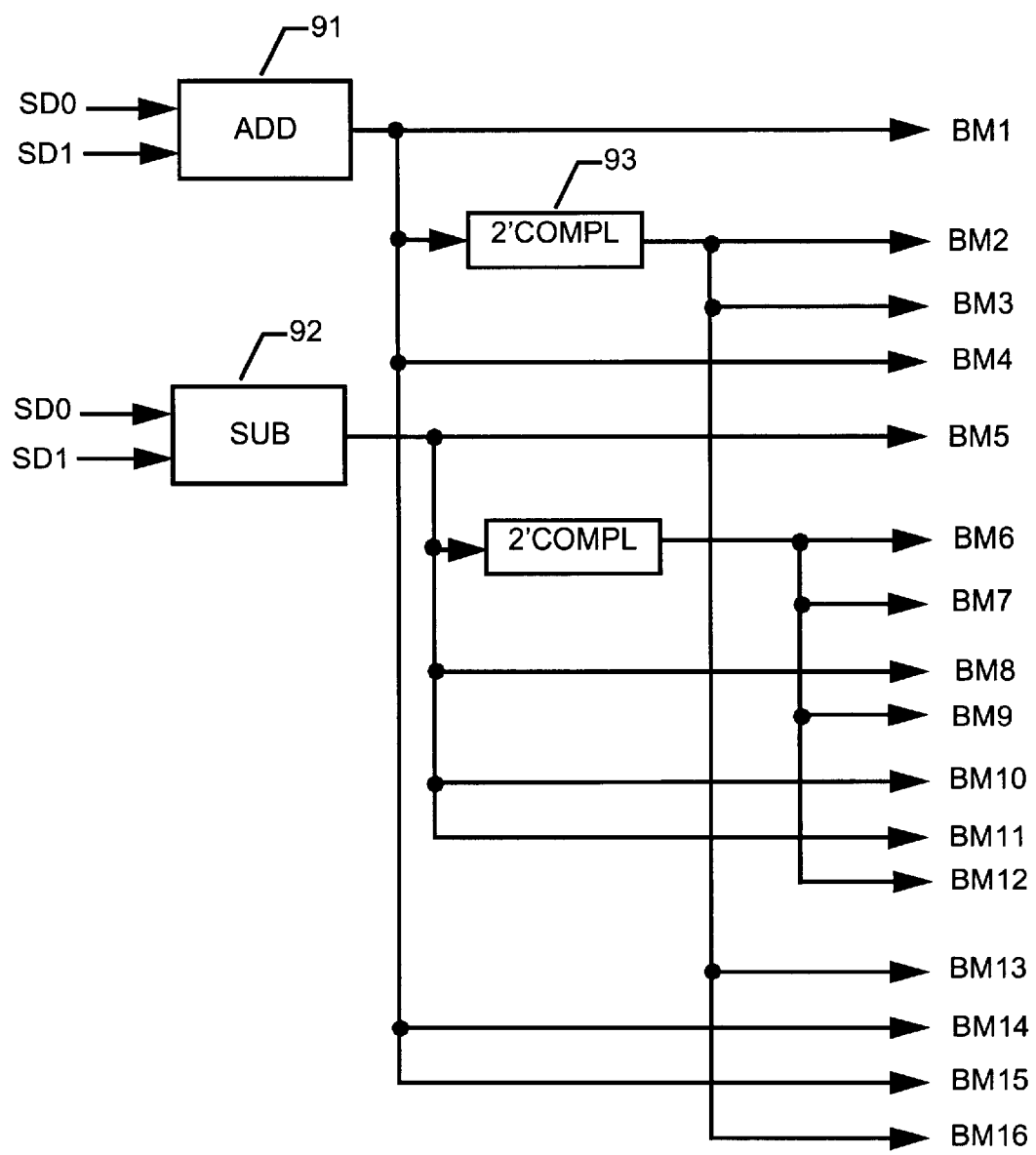
FIGURE 9. BRANCH METRIC COMPUTING MODULE

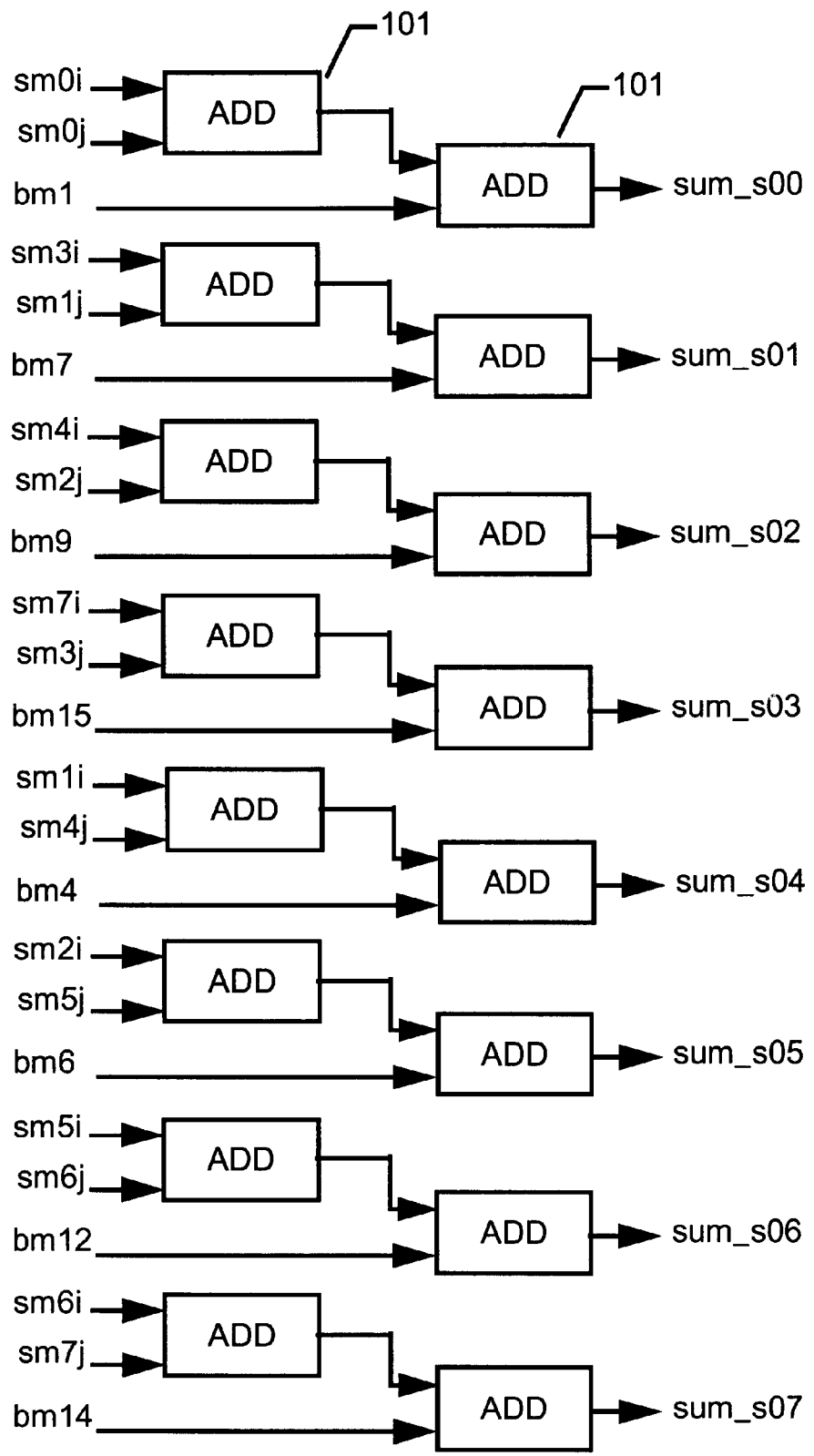
FIGURE 10a. LOG-MAP COMPUTING MODULE

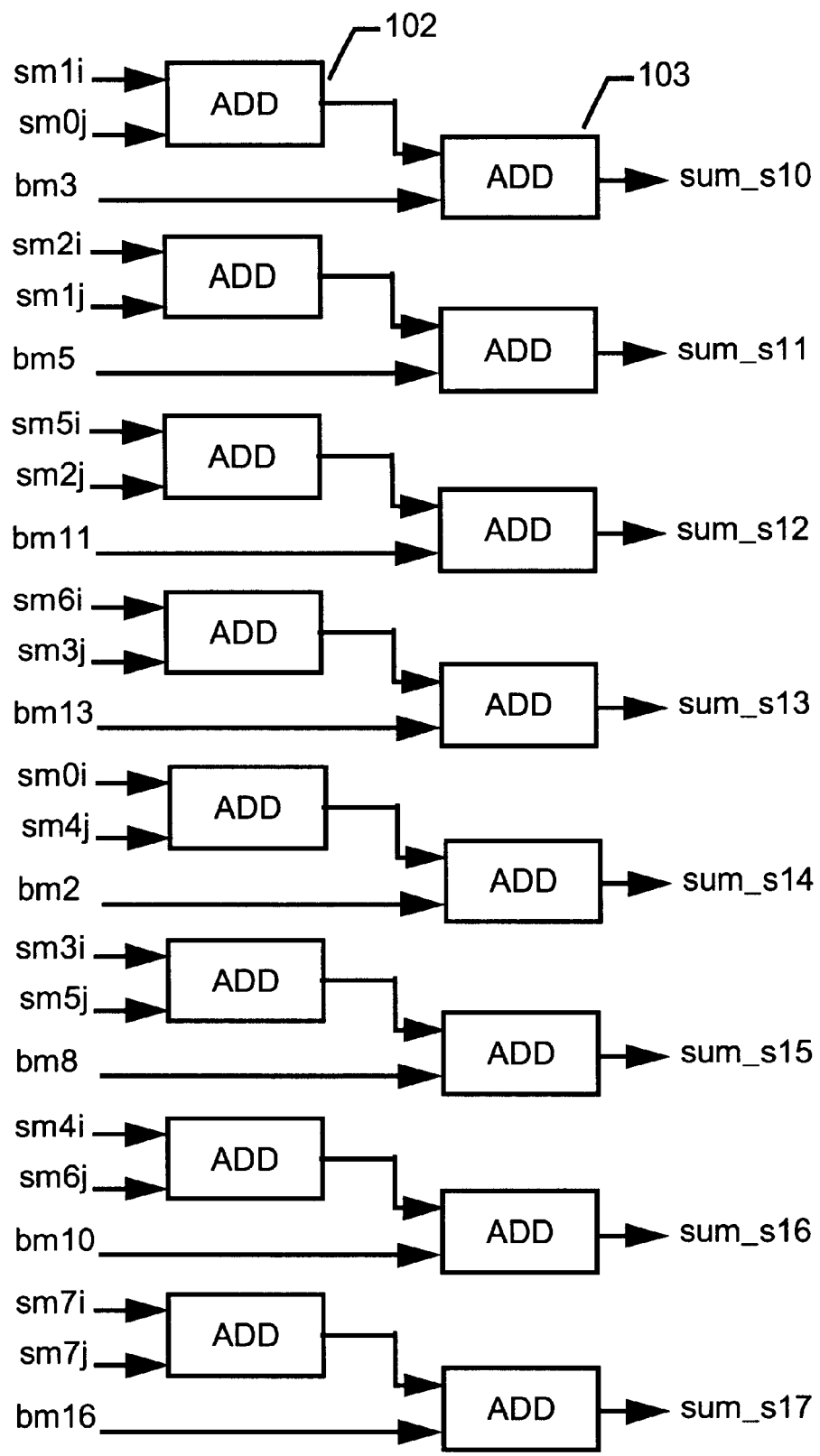
FIGURE 10b. LOG-MAP COMPUTING MODULE

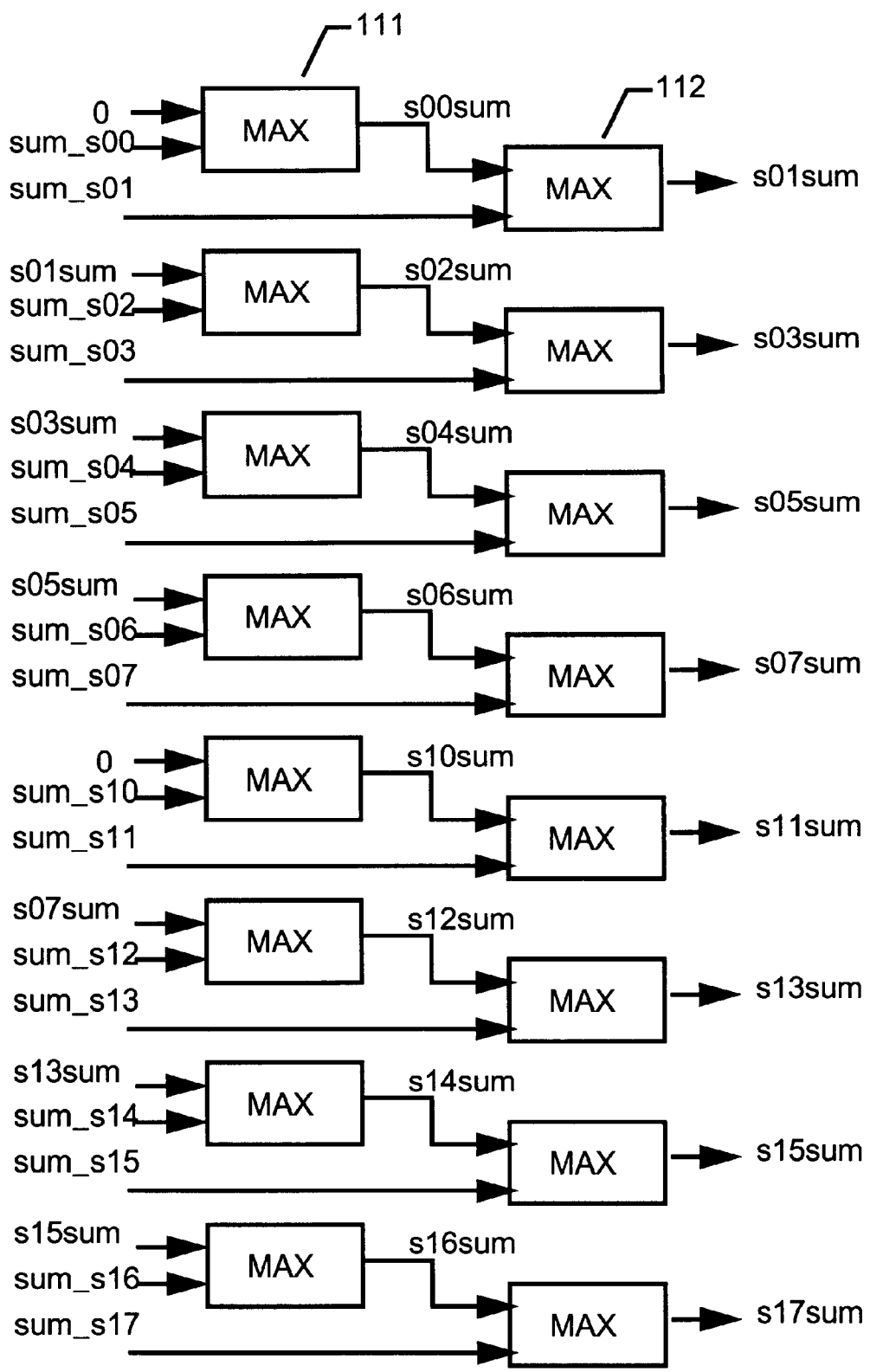
FIGURE 11. Computing Log-MAP for each state

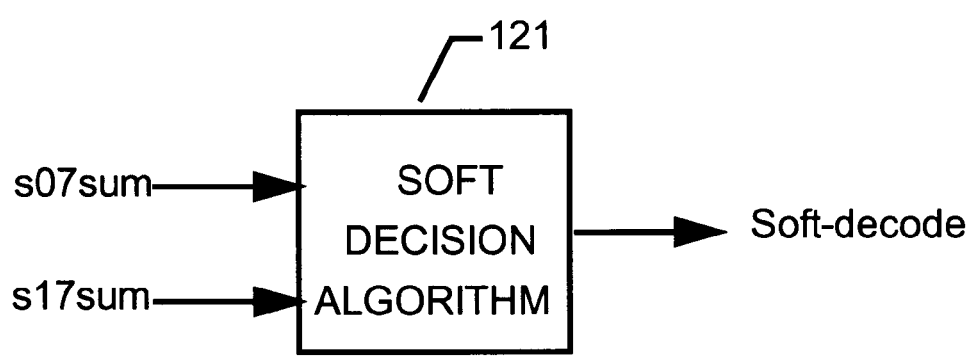
FIGURE 12. Soft Decode output

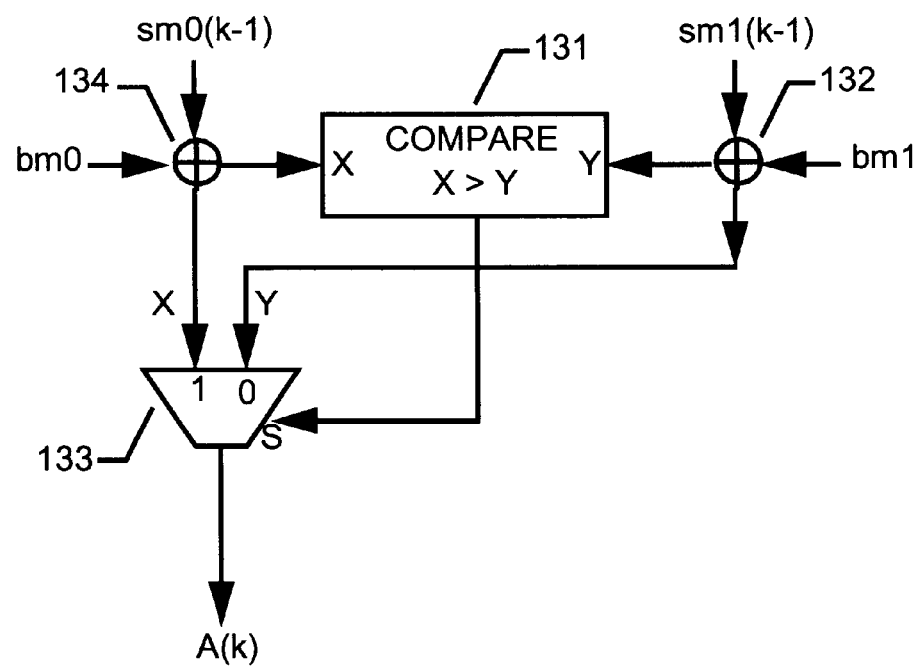
FIGURE 13. Computation of Forward Recursion of state-metric (ACS)

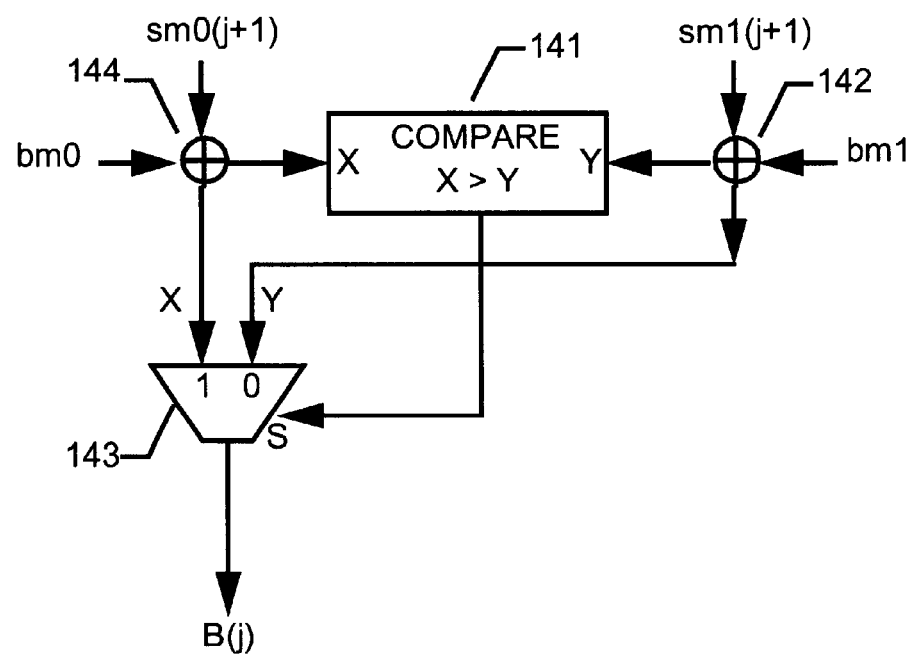
FIGURE 14. Computation of Backward Recursion of state-metric (ACS)

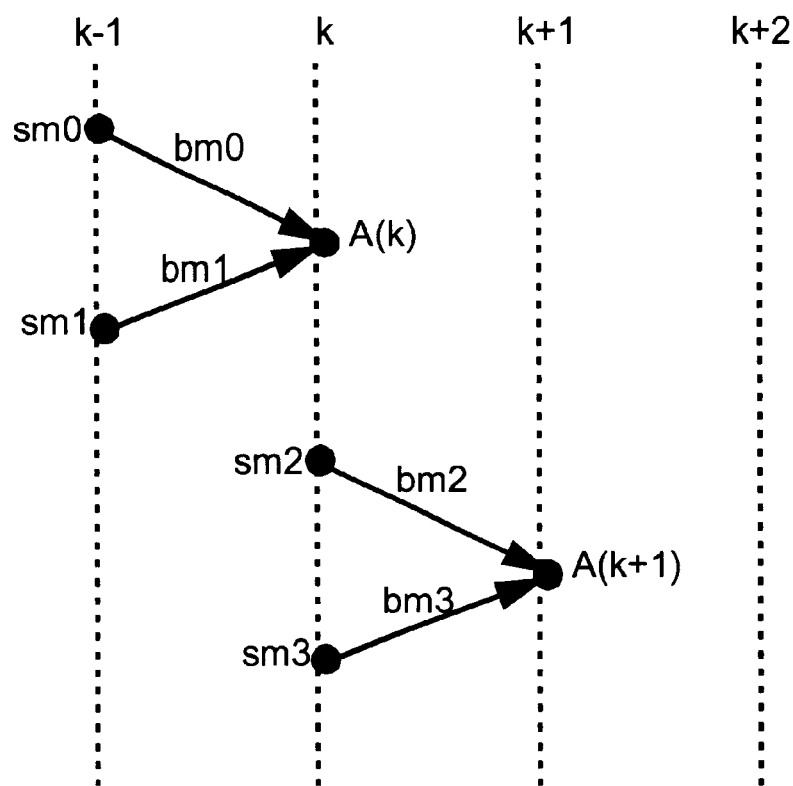
FIGURE 15. Forward computing of Trellis state transitions

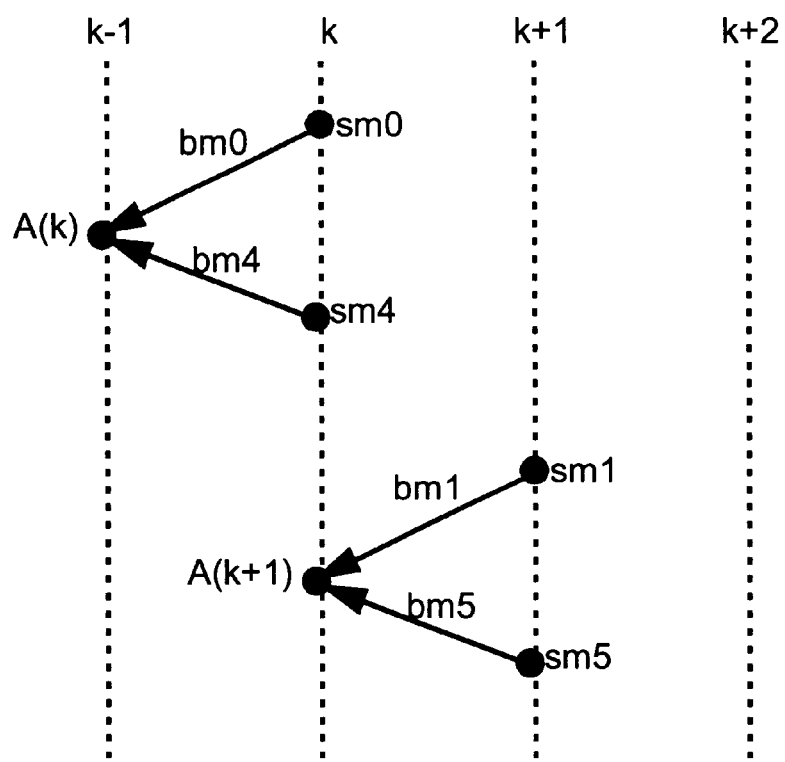
FIGURE 16. Backward computing of Trellis state transitions

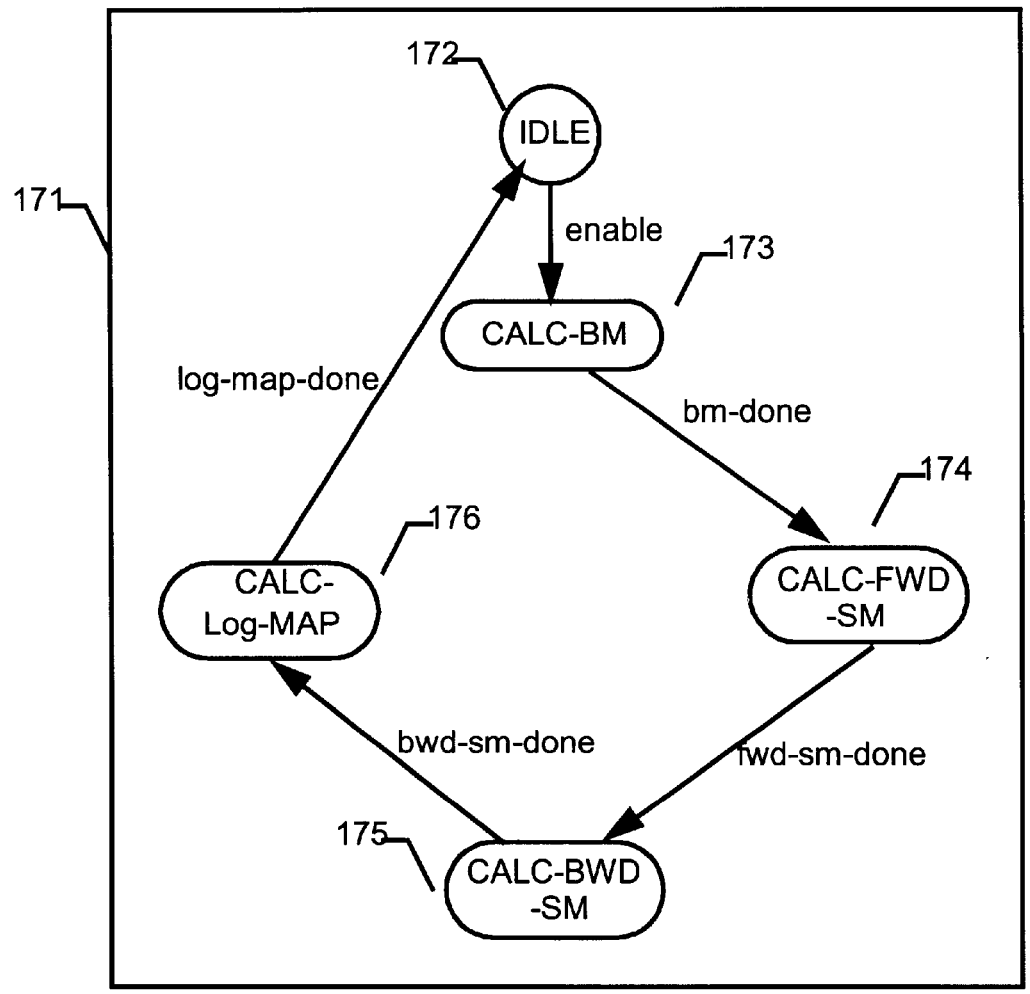
FIGURE 17. State machine operations of Log-MAP Decoder

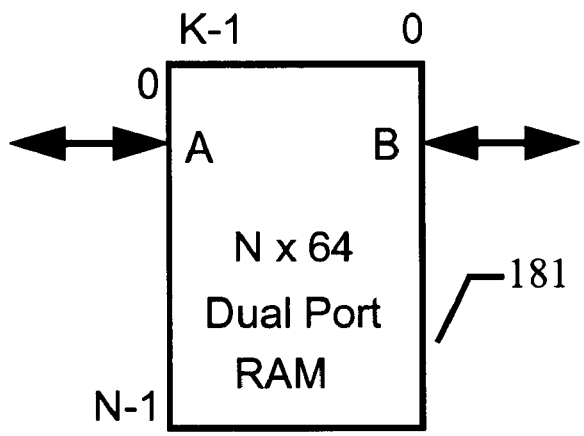
FIGURE 18. BM dual-port Memory Module
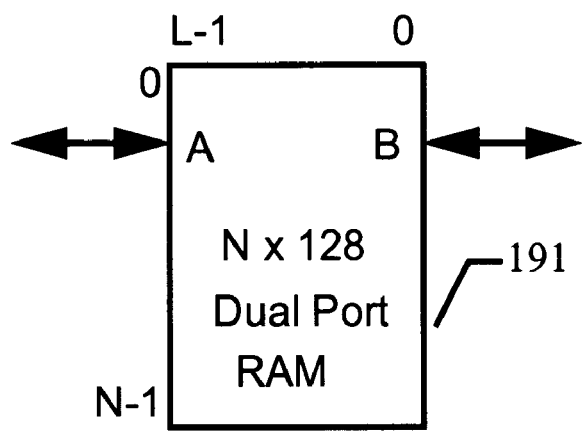
FIGURE 19. SM dual-port Memory Module

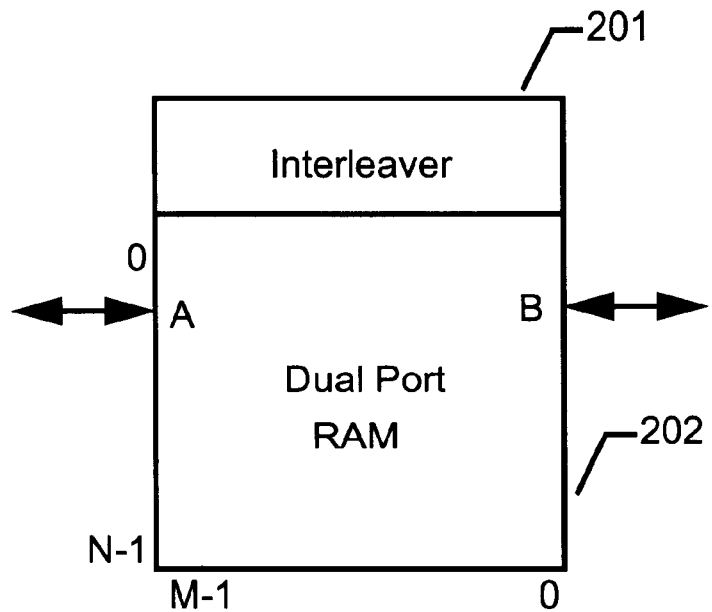
FIGURE 20. Interleaver RAM Memory Module
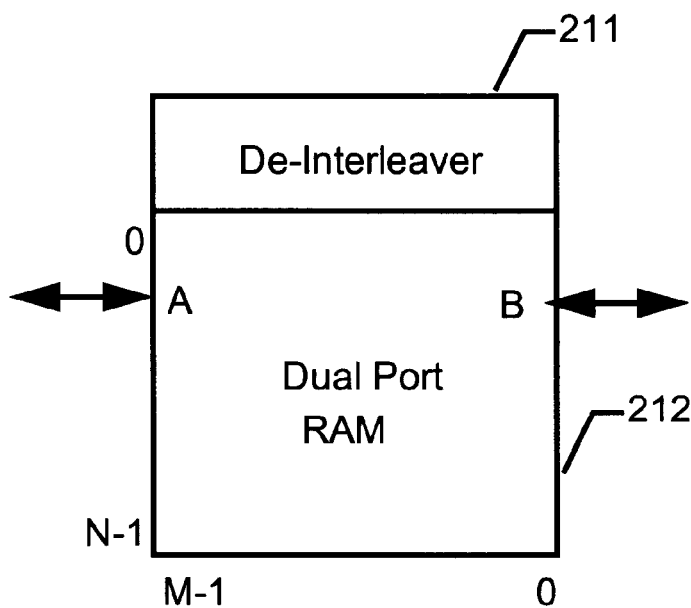
FIGURE 21. De-Interleaver RAM Memory Module

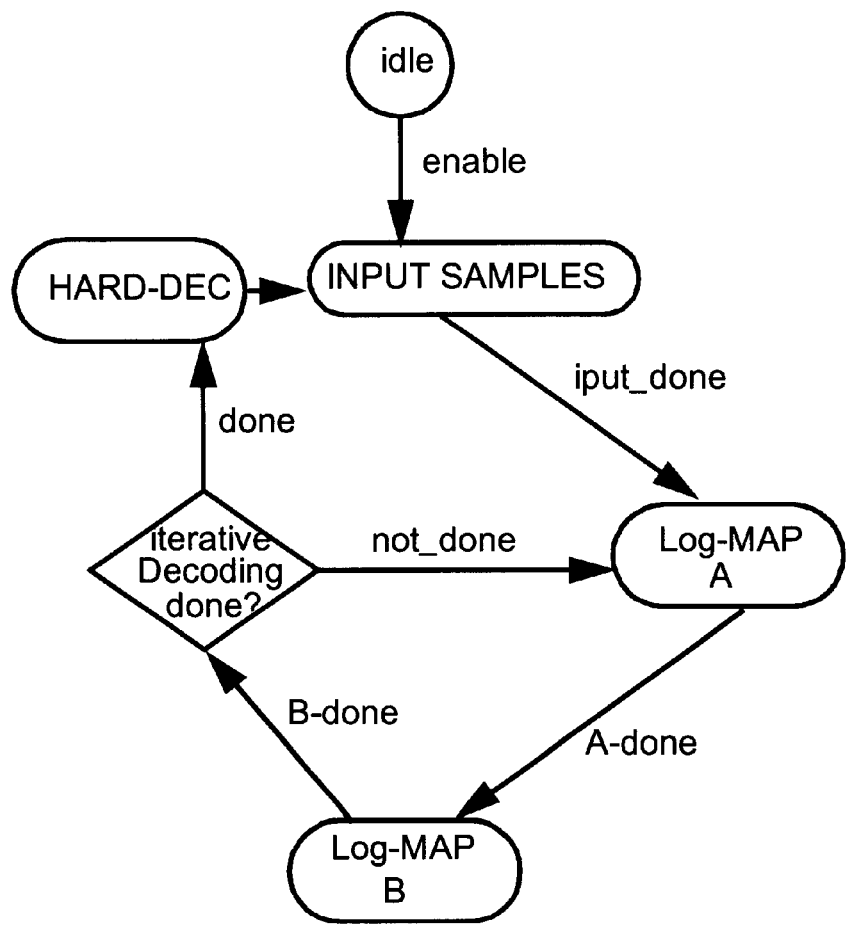
FIGURE 22. State machine operations of Turbo Decoder

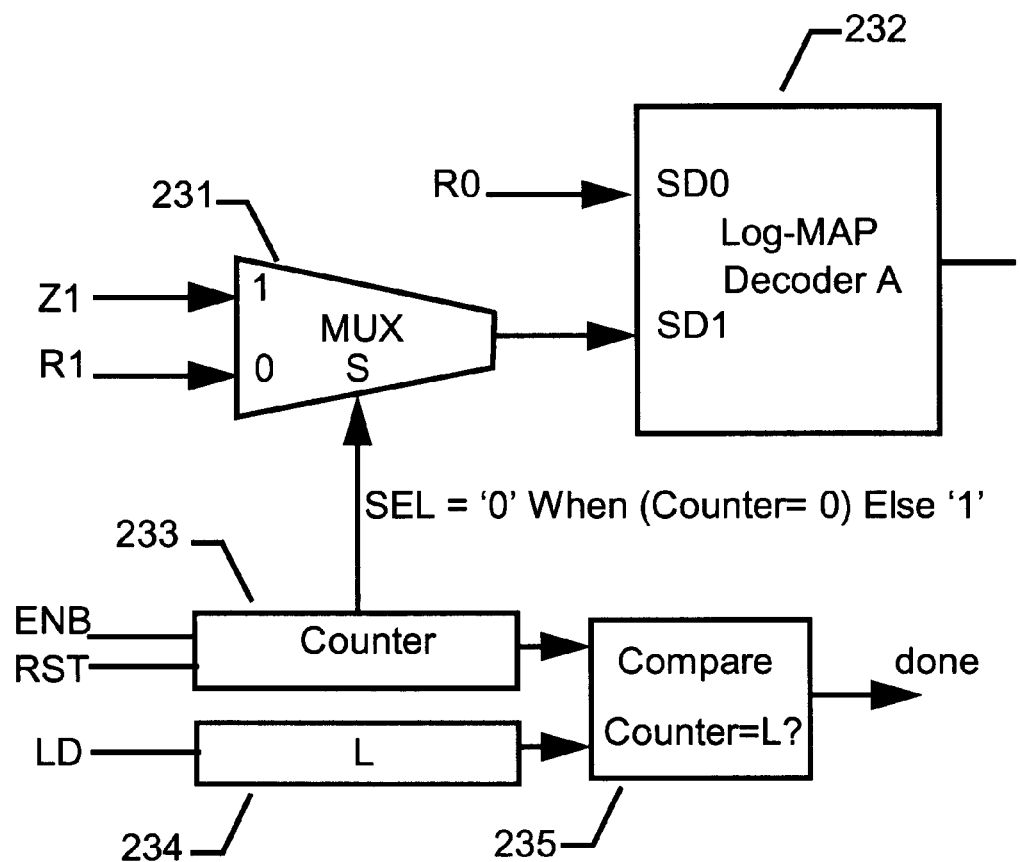
FIGURE 23. Iterative decoding feedback control Mux

HIGH SPEED TURBO CODES DECODER FOR 3G USING PIPELINED SISO LOG-MAP DECODERS ARCHITECTURE

CROSS REFERENCE TO RELATED APPLICATIONS

This application is based upon the development of IP Core ASIC products for 3G-WDMA and 3G-CDMA2000 wireless communications applications by IComm Technologies, Inc. since early 1998. This application also references to the prior U.S. provisional application Ser. No. 60/131,516 filed May 26. 1999.

BACKGROUND OF INVENTION

1. Field of the Invention

This invention relates to Baseband Processor and Error-Correction Codes for Third Generation (3G) Wireless Mobile Communications; and more particularly, the invention relates to a very high speed Turbo Codes Decoder using pipelined Log-MAP decoders method for for Third Generation (3G) CDMA2000 and 3G-WCDMA.

2. Description of Prior Art

Turbo Codes decoding is based upon the classic forward error correction concepts that include the use of recursive systematic constituent Encoders (RSC) and Interleaver to reduce $E_b/N_0$ for power-limited wireless applications such as digital 3G Wireless Mobile Communications. A Turbo Codes Decoder is an important part of the baseband processor in the wireless communication Receiver, which is used to reconstruct the corrupted and noisy received data and to improve BER (bit-error-rate) throughput. FIG. 1. shows an example of a 3G Receiver with a Turbo Codes Decoder 13 which decodes data from the Demodulator 11 and De-mapping 12 modules, and sends decoded data to the MAC layer 14. FIG. 2. shows an example of an 8-PSK constellation points 21 produced by the Demodulator module 11. The De-mapping 12 module uses the 8-PSK constellation points 21 to convert into binary data 22 and send to the Turbo Codes Decoder 13. The data 22 is then decoded and reconstructed by the Turbo Codes Decoder 13 and send to the MAC layer 14.

A most widely used forward-error-correction FEC scheme is the Viterbi Algorithm Decoder in both wired and wireless application. A drawback is that it requires a long waiting for decisions until the whole. sequence has been received. A delay of six time the memory length of the received data is required for decoding. One of the more effective FEC, with higher complexity, a MAP algorithm used to decode received message has comprised the steps of very computational complex, requiring many multiplications and additions per bit to compute the posteriori probability. A major difficulty with the use of the MAP algorithm has been the implementation in semiconductor ASIC devices, the complexity the multiplications and additions which will slow down the decoding process and reducing the throughput data rates. Furthermore, even under the best conditions, each operations used in the MAP algorithm requires a large circuits in the ASIC. The result is costly, and low performance in bit rates throughput.

Recently introduced by the 3GPP organization a new class of codes using parallel concatenated codes (PCCC) that include the use of the classic recursive systematic constituent Encoders (RSC) and Interleaver as shown in FIG. 3. offers great improvement. An example of the 3GPP Turbo Codes PCCC Turbo Codes with 8-states and rate ⅓ is shown in FIG. 3. data enters the two systematic encoders 31 33 separated by an interleaver 32. An output codeword consists of the source data bit followed by the parity check bits of the two encoders. Other prior work of error correction codes was done by Berrou et al. describing a parallel concatenated codes which is are much complex encoding structure that are not suitable for portable wireless device. Another patent U.S. Pat. No. 6,023,783 by Divsalar et al. describes a more improved encoding method than Berrou using some basic mathematical concepts of parallel concatenated codes. However, patents by Berrou, the U.S. Pat. No. 6,023,783, and others only describe the basic concept of parallel concatenated codes using mathematical equations which are good for research in deep space communications and other government projects but are not feasible, economical, and practical for consumers. The encoding of data is simple and can be easily implemented with a few xor and flip-flop logic gates. But the decoding the Turbo Codes is much more difficult to implement in ASIC or software. The prior arts describe briefly the implementation of the Turbo Codes Decoder which are mostly for deep space communications and requires much more hardware, powers and costs.

All the prior arts of Turbo Codes fail to achieve a simpler method for a Turbo Codes Decoder as it is required and desired for 3G cellular phones and 3G personal communication devices including high speed data throughput, low power consumption, lower costs, limited bandwidth, and limited power transmitter in noisy environment.

SUMMARY OF INVENTION

The present invention directed Turbo Codes Decoder to implement a more efficient, practical and simpler method to achieve the requirements for 3G cellular phones and 3G personal communication devices including higher speed data throughput, lower power consumptions, lower costs, and simpler implementation in ASIC or software. The present invention encompasses improved and simplified Turbo Codes Decoder method and apparatus to deliver higher speed and lower power especially for 3G applications. An exemplary embodiment Turbo Codes Decoder utilizes two pipelined and serially concatenated SISO Log-MAP Decoders with Interleaver-Memory at the output of the first decoder and a De-interleaver-Memory at the second decoder. The two decoders function in a pipelined scheme with delay latency N; while the first decoder is decoding data in the de-interleaver-Memory, the second decoder performs decoding data in the interleaver-Memory, which produces a decoded output every clock cycle in results. Accordingly, several objects and advantages of our Turbo Codes Decoder are:

To deliver higher speed throughput and lower power consumption

To utilize SISO Log-MAP decoder for faster decoding and simplified implementation in ASICr with the use ofbinary adders for computation.

To perform re-iterative decoding of data back-and-forth between the two Log-MAP decoders in a pipelined scheme until a decision is made. In such pipelined scheme, a decoded output data is produced each clock cycle.

To improve higher performance in term of symbol error probability and low BER for 3G applications such as 3G W-CDMA, and 3G CDMA2000 operating at very high bit-rate up to 100 Mbps in a low power noisy environment.

To utilize an simplified and improved architecture ofSISO Log-MAP decoder including branch-meric (BM) calculations module, recursive state-metric (SM) forward/ backward calculations module, Log-MAP posteriori probability calc ulations module, and output decision module.

To reduce complexity of multiplier circuits in MAP algorithm by perform the entire MAP algorithm in Log domain with the uses of binary der circuits which are more suitable for ASIC implementation while still maintain a high level of performance output.

To design an improve Log-MAP Decoder using high level design language of VHDL which can be synthesized into custom ASIC and FPGA devices.

Still further objects and advantages will become apparent to one skill in the art from a consideration of the ensuing descriptions and accompanying drawings.

BRIEF DESCRIPTION OF DRAWINGS

FIG. 1. is a typical 3G Receiver Functional Block Diagram which use Turbo Codes Decoder for error-correction.

FIG. 2. is an example of an 8-PSK (QPSK) constellations of the receiving signals.

FIG. 3. is a block diagram of the 8-states Parallel Concatenated Convolutional Codes.

FIG. 4. is the Turbo Codes Decoder System Block Diagram showing Log-MAP Decoder, Interleavers, Input Shift registers and control logics.

FIG. 5. is a block diagram of the Input Buffer Shift Registers.

FIG. 5b. is the Soft Values Mapping ROM Table.

FIG. 6. is the input Buffer Interface Timing.

FIG. 7. is a block diagram of the 8-states SISO Log-MAP Decoder showing Branch Metric module, State Metric module, Log-MAP module, am State and Branch Memory modules.

FIG. 8. is the 8-States Trellis Diagram of a SISO Log-MAP Decoder.

FIG. 9. is a block diagram of the BRANCH METRIC COMPUTING module.

FIG. 10a. is a block diagram of the Log-MAP computing for u=0.

FIG. 10b. is a block diagram of the Log-MAP computing for u=1.

FIG. 11. is a block diagram of the Log-MAP Compare & Select 1 maximumogic for each state.

FIG. 12. is a block diagram of the Soft Decode module.

FIG. 13. is a block diagram of the Computation of Forward Recursion of stSte-m Mric module (FACS).

FIG. 14. is a block diagram of the Computation of Backward Recursion of st Ste-m Mric module (BACS).

FIG. 15. showing FoState Metric rward computing of Trellis state transitions.

FIG. 16. showing BaState Metric ckward computing of Trellis state transitions.

FIG. 17. is a block diagram of the State Machine operations of Log-MAP Decoder.

FIG. 18. is a block diagram of the BM dual-port Memory Module.

FIG. 19. is a block diagram of the SM dual-port Memory Module.

FIG. 20. is a block diagram of the Interleaver RAM Memory Memory Module.

FIG. 21. is a block diagram of the De-Interleaver RAM Memory Module.

FIG. 22. is a block diagram of the State Machine operations of the Turbo Codes Decoder.

FIG. 23. is a block diagram of the Iterative decoding feedback control Mux.

DETAILED DESCRIPTION

Turbo Codes Decoder

An illustration of a 3GPP 8-state Parallel Concatenated Convolutional Code (PCCC), with coding rate $\frac{1}{3}$, constraint length K=4, using SISO Log-MAP Decoders is provided for simplicity in descriptions of the invention. As shown in FIG. 4, a Turbo Codes Decoder has two concatenated LoSISO g-MAP Decoders A 42 and B 44 connected in a feedback loop with Interleaver Memory 43 and De-Interleaver Memory 45 in between. An input Buffer 41, shown in details FIG. 5; has one serial-to-par(S/P) converter 51, and three shift registers 52 of length N for block decoding. A control logic module (CLSM) 47, shown in FIG. 4, consists of various state-machines which in turn control all the operations of the Turbo Codes Decoder. The hard-decoder module 46 outputs the final decoded data. Signals R2, R1, R0 are the received data shifted out from the Shift Registers. Signal XO1, and XO2 are the output soft decision of the Log-MAP Decoders A 42 and B 44 respectively, which are stored in the Interleaver Memory 43 and De-Interleaver Memory 45 module. Signal Z2 and Z1 are the output of the Interleaver Memory 43 and De-Interleaver Memory 45 where the Z2 is feed into Log-MAP decoder B 44, and Z1 is feedback into Log-MAP decoder A 42 for iterative decoding.

In accordance with the invention, the Turbo Codes Decoder decodes an 8-state Parallel Concatenated Convolutional Code (PCCC), with coding rate $\frac{1}{3}$, constraint length K=4, using L SISOog-MAP (Maximum a Posteriori) Decoders in pipeline. The Turbo Codes Decoder can also decode a 16-states or more PCCC with different code rates.

As shown in FIG. 1. the Turbo Codes Decoder functions effectively as follows:

Serial received data are shifted into 3 Shift Registers to produce R0, R1, and R2 data sequence.

The soft value module converts the input data R0, R1, and R2 into 3-bit quantization soft-values according to TABLE 1.

When a block of N input data is received, the Turbo Decoder starts the Log-MAP Decoder A to decode the N input bits based on the soft-values of R0 and R1, then stores the outputs in the Interleaver Memory.

Next, the Turbo Decoder starts the Log-MAP Decoder B to decode the N input bits based on the soft-values of R2 and Z2, then store the outputs in the De-Interleaver Memory.

The Turbo Decoder will now do the iterative decoding for L number of times. The Log-MAP Decoder A now uses the signals Z1 and R1 as inputs. The Log-MAP Decoder B uses the sigZ2 and R2 as inputs.

When the iterative decoding sequences are done, the Turbo Decoder starts the hard-decision operations to compute and produce soft-decision outputs.

Input Buffer Shift Registers

As shown in FIG. 5., the Turbo Codes Input Buffer has a serial-to-parallel (S/P) converter 51, and three Shift Registers 52 of N bits to store each block of N input data. A 3-bit Seral-to Parallel (S/P) converter 51 converts input data into 3 serial data streams which are then shifted into the corresponding shift registers 52. As shown in FIG. 6. is the timing interface with the input buffer from the external hosts or the Demodulator/De-mapping 12. A bit clock (BCLK) in conjunction with the frame sync (RSYNC) are used to shift data into the SIP converter 51 when the RSYNC is active (HIGH).

As shown in FIG. 5b., each input data bit R0, R1, and R2 entering into the Log-MAP Decoder are assigned a soft-value of L-bit quantization as shown in the following TABLE 1. The same soft values are used as the threshold for the final hard code data.

TABLE 1

Soft values

| Soft Values L-bit | Input data Bit |
|---|---|
| .....011 | 0 |
| .....101 | 1 |

SISO Log-MAP Decoder shown in FIG. 7., an SISO Log-MAP Decoder 42 44 comprises of a Branch Metric (BM) computation module 71, a State Metric (SM) computation module 72, a Log-MAP computation module 73, a BM Memory module 74, a SM Memory module 75, and a Control Logic State Machine module 76. Soft-values inputs enter the Branch Metric (BM) computation module 71, where Euclidean distance is calculated for each branch, the output branch metrics are stored in the BM Memory module 74. The State Metric (SM) computation module 72 reads branch metrics from the BM Memory 74 and compute the state metric for each state, the output state-metrics are stored in the SM Memory module 75. The Log-MAP computation module 73 reads both branch-metrics and state-metrics from BM memory 74 and SM memory 75 modules to compute the Log Maximum a Posteriori probability and produce soft-decision output. The Control Logic State-machine module 76 provides the overall operations of the decoding process.

As shown in FIG. 7., the Log-MAP Decoder 42 44 functions effectively as follows:

The Log-MAP Decoder 42 44 reads each soft-values (SD) data pair input, then computes branch-metric (BM) values for all 16 paths in the Turbo Codes Trellis 85 as shown in FIG. 8., then stores all 16 BM data into BM Memory 74. It repeats computing BM values for each input data until all N samples are calculated and stored in BM Memory 74.

The Log-MAP Decoder 42 44 reads BM values from BM Memory 74 and SM values from SM Memory 75, and computes the forward state-metric (SM) for all 8 states in the Trellis 85 as shown in FIG. 8., then store all 8 forward SM data into SM Memory 75. It repeats computing forward SM values for each input data until all N samples are calculated and stored in SM Memory 75.

The Log-MAP Decoder 42 44 reads BM values from BM Memory 74 and SM values from SM Memory 75, and computes the backward state-metric (SM) for all 8 states in the Trellis 85 as shown in FIG. 8., then store all 8 backward SM data into the SM Memory 75. It repeats computing backward SM values for each input data until all N samples are calculated and stored in SM Memory 75.

The Log-MAP Decoder 42 44 then computed Log-MAP posteriori probability for u=0 and u=1 using BM values and SM values from BM Memory 74 and SM Memory 75. It repeats computing Log-MAP posteriori probability for each input data until all N samples are calculated. The Log-MAP Decoder then decodes data by making soft decision based on the posteriori probability for each stage and produce soft-decision output, until all N inputs are decoded.

Branch Metric Computation Module

The Branch Metric (BM) computation module 71 computes the Euclidean distance for each branch in the 8-states Trellis 85 as shown in the FIG. 8. based on the following equations:

$$\text{Local Euclidean distances values} = SD0*G0 + SD1*G1$$

The SD0 and SD1 are soft-values from TABLE 1., G0 and G1 are the expected input for each path in the Trellis 85. G0 and G1 are coded as signed antipodal values, meaning that 0 corresponds to +1 and 1 corresponds to −1. Therefore, the local Euclidean distances for each path in the Trellis 85 are computed by the following equations:

$$M1 = SD0 + SD1$$

$$M2 = -M1$$

$$M3 = M2$$

$$M4 = M1$$

$$M5 = -SD0 + SD1$$

$$M6 = -M5$$

$$M7 = M6$$

$$M8 = M5$$

$$M9 = M6$$

$$M10 = M5$$

$$M11 = M5$$

$$M12 = M6$$

$$M13 = M2$$

$$M14 = M1$$

$$M15 = M2$$

$$M16 = M2$$

As shown in FIG. 9., the Branch Metric Computing module comprise of one L-bit Adder 91, one L-bit Subtracter 92, and a 2'complemeter 93. It computes the Euclidean distances for path M1 and M5. Path M2 is 2'complement of path M1. Path M6 is 2'complement of M5. Path M3 is the same path M2, path M4 is the same as path M1, path M7 is the same as path M6, path M8 is the same as path M5, path M9 is the same as path M6 path M10 is the same as path M5, path M11 is the same as path M5, path M12 is the same as path M6, path M13 is the same as path M2, path M14 is the same as path M1, path M15 is the same as path M1, and path M16 is the same as path M2.

State Metric Computing Module

The State Metric Computing module 72 calculates the probability A(k) of each state transition in forward recursion and the probability B(k) in backward recursion. FIG. 13. shows the implementation of state-metric in forward recursion with Add-Compare-Select (ACS) logic, and FIG. 14. shows the implementation of state-metric in backward recursion with Add-Compare-Select (ACS) logic. The calculations are performed at each node in the Turbo Codes Trellis 85 (FIG. 8) in both forward and backward recursion. The FIG. 15. shows the forward state transitions in the Turbo Codes Trellis 85 (FIG. 8), and FIG. 16. show the backward state transitions in the Turbo Codes Trellis 85 (FIG. 8). Each node in the Trellis 85 as shown in FIG. 8. has two entering paths: one-path 84 and zero-path 83 from the two nodes in the previous stage.

In an examplanary embodiment, the ACS logic comprises of an Adder 132, an Adder 134, a Comparator 131, and a Multiplexer 133. In the forward recursion, the Adder 132 computes the sum of the branch metric and state metric in the one-path 84 from the state s(k−1) of previous stage (k−1). Adder 134 computes the sum of the branch metric and state metric in the zero-path 83 from the state (k−1) of previous stage (k−1). The Comparator 131 compares the two sums and the Mulitplexer 133 selects the larger sum for the state s(k) of current stage (k). In the backward recursion, the Adder 142 computes the sum of the branch metric and state metric in the one-path 84 from the state s(j+1) of previous stage (J+1). Adder 144 computes the sum of the branch metric and state metric in the zero-path 83 from the state s(j+1) of previous stage (J+1). The Comparator 141 compares the two sums and the Mulitplexer 143 selects the larger sum for the state s(j) of current stage (j).

The Equations for the ACS are shown below:

$$A(k)=\text{MAX}\,[(bm0+sm0(k-1)),\,(bm1+sm1(k-1))]$$

$$B(j)=\text{MAX}\,[(bm0+sm0(j+1)),\,(bm1+sm1(j+1))]$$

Time (k−1) is the previous stage of (k) in forward recursion as shown in FIG. 15., and time (j+1) is the previous stage of (j) in backward recursion as shown in FIG. 16.

Log-MAP computing Module

The Log-MAP computing module calculates the posteriori probability for u=0 and u=1, for each path entering each state in the Turbo Codes Trellis 85 corresponding to u=0 and u=1 or referred as zero-path 83 and one-path 84. The accumulated probabilities are compared and selected the u with larger probability. The soft-decision are made based on the final probability selected for each bit. FIG. 10a shows the implementation for calculating the posteriori probability for u=0. FIG. 10b. shows the implementation for calculate the posteriori probability for u=1. FIG. 11. shows the implementation of compare-and-select the u with larger probability. FIG. 12. shows the implementation of the soft-decode compare logic to produce output bits based on the posteriori probability of u=0 and u=1. The equations for calculation the accumulated probabilities for each state and compare-and-select are shown below:

$$\text{sum\_s00}=sm0i+bm1+sm0j$$

$$\text{sum\_s01}=sm3i+bm7+sm1j$$

$$\text{sum\_s02}=sm4i+bm9+sm2j$$

$$\text{sum\_s03}=sm7i+bm15+sm3j$$

$$\text{sum\_s04}=sm1i+bm4+sm4j$$

$$\text{sum\_s05}=sm2i+bm6+sm5j$$

$$\text{sum\_s06}=sm5i+bm12+sm6j$$

$$\text{sum\_s07}=sm6i+bm14+sm7j$$

$$\text{sum\_s10}=sm1i+bm3+sm0j$$

$$\text{sum\_s11}=sm2i+bm5+sm1j$$

$$\text{sum\_s12}=sm5i+bm11+sm2j$$

$$\text{sum\_s13}=sm6i+bm13+sm3j$$

$$\text{sum\_s14}=sm0i+bm2+sm4j$$

$$\text{sum\_s15}=sm3i+bm8+sm5j$$

$$\text{sum\_s16}=sm4i+bm10+sm6j$$

$$\text{sum\_s17}=sm7i+bm16+sm7j$$

$$s00\text{sum}=\text{MAX}[\text{sum\_s00},\,0]$$

$$s01\text{sum}=\text{MAX}[\text{sum\_s01},\,s00\text{sum}]$$

$$s02\text{sum}=\text{MAX}[\text{sum\_s02},\,s01\text{sum}]$$

$$s03\text{sum}=\text{MAX}[\text{sum\_s03},\,s02\text{sum}]$$

$$s04\text{sum}=\text{MAX}[\text{sum\_s04},\,s03\text{sum}]$$

$$s05\text{sum}=\text{MAX}[\text{sum\_s05},\,s04\text{sum}]$$

$$s06\text{sum}=\text{MAX}[\text{sum\_s06},\,s05\text{sum}]$$

$$s07\text{sum}=\text{MAX}[\text{sum\_s07},\,s06\text{sum}]$$

$$s10\text{sum}=\text{MAX}[\text{sum\_s10},\,0]$$

$$s11\text{sum}=\text{MAX}[\text{sum\_s11},\,s10\text{sum}]$$

$$s12\text{sum}=\text{MAX}[\text{sum\_s12},\,s11\text{sum}]$$

$$s13\text{sum}=\text{MAX}[\text{sum\_s13},\,s12\text{sum}]$$

$$s14\text{sum}=\text{MAX}[\text{sum\_s14},\,s13\text{sum}]$$

$$s15\text{sum}=\text{MAX}[\text{sum\_s15},\,s14\text{sum}]$$

$$s16\text{sum}=\text{MAX}[\text{sum\_s16},\,s15\text{sum}]$$

$$s17\text{sum}=\text{MAX}[\text{sum\_s17},\,s16\text{sum}]$$

Control Logics—State Machine (CLSM) Module

As shown in FIG. 7. the Control Logics module controls the overall operations of the Log- MAP Decoder. The control logic state machine 171, referred as CLSM, is shown in FIG. 17. The CLSM module 171 (FIG. 17.) operates effectively as the followings. Initially, it stays in IDLE state 172. When the decoder is enable, the CLSM transitions to CALC-BM state 173, it then starts the Branch Metric (BM) module operations and monitor for completion. When Branch Metric calculations are done, referred as bm-done the CLSM transitions to CALC-FWD-SM state 174, it then tarts the State Metric module (SM) in forward recursion operation. When the forward SM state metric calculations are done, referred as fwd-sm, the CLSM transitions to CALC-BWD-SM state 175, it then starts the State Metric module (SM ) in backward recursion operations. When backward SM state metric calculations are done, referred as bwd-sm-done the CLSM transitions to CALC-Log-MAP state 176, it then starts the Log-MAP computation module to calculate the maximum a posteriori probability to produce soft decode output. When Log-MAP calculations are done, referred as log-map-done, it transitions back to IDLE state 172.

BM Memory and SM Memory

The Branch-Metric Memory 74 and the State-Metric Memory 75 are shown in FIG. 7. as the data storage components for BM module 71 and SM module 72. The Branch Metric Memory module is a dual-port RAM contains M-bit of N memory locations as shown in FIG. 18. The State Metric Memory module is a dual-port RAM contains K-bit of N memory locations as shown in FIG. 19. Data can be written into one port while reading at the other port.

Interleaver Memory and De-interleaver Memory

As shown in FIG. 4., the Interleaver Memory 43 stores data for the first decoder A 42, and De-interleaver memory 45 stores data for the second decoder B 44. In an iterative pipelined decoding, the decoder A 42 reads data from De-interleaver memory 45 and writes results data into Interleaver memory 43, the decoder B 44 reads data from Interleaver memory 43 and write results into De-interleaver memory 45. The Interleaver/De-interleaver Memory module uses an interleaver to generate the write address sequences of Memory in write mode. In read mode, the memory read address are normal sequences.

As shown in FIG. 20., the Interleaver memory 43 comprises of an Interleaver module 201 and a dual-port RAM 202 contains M-bit of N memory locations. The Interleaver is a Turbo code internal interleaver as defined by 3GPP standard ETSI TS 125 222 V3.2.1 (2000–05). The Interleaver permutes the address input port A for all write operations into dual-port RAM module. Reading data from output port B are done with normal address input.

As shown in FIG. 21., the De-interleaver memory 45 comprises of an De-Interleaver module 211 and a dual-port RAM 212 contains M-bit of N memory locations. The De-Interleaver is a Turbo code internal interleaver as defined by 3GPP standard ETSI TS 125 222 V3.2.1 (2000–05). The De-Interleaver permutes the address input port A for all write operations into dual-port RAM module. Reading data from output port B are done with normal address input.

Turbo Codes Decoder Control Logics—State Machine (TDCLSM)

As shown in FIG. 4. the Turbo Decoder Control Logics module 47, referred as TDCLSM, controls the overall operations of the Turbo Codes Decoder. The state-machine is shown in the FIG. 22. Initially, the TDCLSM 47 stays in IDLE state 221. When decoder enable signal is active, the TDCLSM 47 transitions to INPUT states 222. The TDCLSM 47 starts the input shifting operations until the input buffer 41 is fill indicated by input-ready signal. Then, the TDCLSM 47 transitions to Log-MAP A state 223 and starts the operations of Log-MAP Decoder A 42. When the Lof-MAP A 42 is done. the TDCLSM 47 transitions to the Log-MAP B state 224 and starts the Log-MAP Decoder B 44. When Log-MAP B 44 is done, the TDCLSM 47 starts the iterative decoding for J number of times. When the iterative decoding sequences are done, the TDCLSM 47 transitions to HARD-DEC state 225 and produces the hard-decode outputs. Then the TDCLSM 47 transitions to the INPUT state to start decoding another block of data.

Iterative Decoding

Turbo Codes decoder performs iterative decoding L times by feeding back the output Z1 of the second Log-MAP decoder B into the corresponding first Log-MAP decoder A, before making decision for hard- decoding output. As shown in FIG. 13., the Counter 233 count the preset number L times, the Multiplexer select the input for the Decoder A. When Counter is zero, the Mux selects the input R1, else it selects the recursive input Z1 from Decoder B.

What is claimed is:

1. A baseband processor for iteratively processing a plurality sequences of received baseband digital signals, the baseband processor subsystem comprising:

at least two soft decision decoders are serially coupled in a circular circuit wherein each decoder processes soft decision from the preceding decoder output data in an iterative mode;

at least one memory module that is electrically coupled to an output of a corresponding soft decision decoder, wherein the output of the memory module associated with the last soft decision decoder is fed back as an input to the first soft decision decoder, wherein the output of the memory module associated with the first soft decision decoder is fed as an input to the second soft decision decoder, wherein the last soft decision decoder receives output of the memory module associated with the preceding soft decision decoder.

2. The baseband processor subsystem according to claim 1, wherein each decoder processes at leat one baseband source signal input and an extrinsic information input coupled from the preceding memory module, wherein each decoder performs the maximum a posteriori decoding algorithm and stores the soft decision into its corresponding memory module.

3. The baseband processor subsystem according to claim 1, wherein each soft decision decoder uses a maximum a posteriori (MAP) probability algorithm, and/or a logarithm approximation algorithm.

4. The baseband processor subsystem according to claim 1, wherein each soft decision decoder implements concatenated convolutional codes.

5. The baseband processor subsystem according to claim 1 further said to be implemented in an ASIC (application-specific-integrated-circuit) of an SoC (system-on-chip) device, or in an VLSI (very large-scale integrated circuits) device for wireless communication applications.

6. A method of iteratively decoding a plurally of sequences of received baseband signals, the method comprising:

processing systematic information data and extrinsic information data using the maximum a posteriori (AP) probability algorithm, and/or logarithm approximation algorithm;

generating soft decision based on the maximum a posteriori (MAP) probability algorithm, and/or logarithm approximation algorithm;

weighting and storing soft decision information into the corresponding memory module;

performing, for a predetermined number of times, iterative decoding from the first to the last of multiple decoders, wherein an output from the last soft decision decoder is fed back as an input to the first soft decision decoder, then from the first to the second decoders, and propagate to the last decoder in a circular circuit.

7. The method according to claim 6, wherein the the soft-in soft-out (SISO) maximum a posteriori (MAP) probability algorithm and logarithm approximation algorithm calculates the alpha function probability A(k) of each state transition in forward recurison and the beta function probability B(k) in backward recursion.

8. The method according to claim 6 further said to be implemented in software coded SISO maximum a posteriori (MAP) probability algorithm and/or logarithm approximation algorithm using any available DSP (digital-signal-prossor) device.

* * * * *

(12) EX PARTE REEXAMINATION CERTIFICATE (6654th)
United States Patent
Nguyen

(10) Number: US 6,813,742 C1
(45) Certificate Issued: Feb. 10, 2009

(54) HIGH SPEED TURBO CODES DECODER FOR 3G USING PIPELINED SISO LOG-MAP DECODERS ARCHITECTURE

(75) Inventor: Quang Nguyen, Allentown, PA (US)

(73) Assignee: ICOMM Technologies, Inc., Fogelsville, PA (US)

Reexamination Request:
No. 90/008,089, Jul. 13, 2006

Reexamination Certificate for:
Patent No.: 6,813,742
Issued: Nov. 2, 2004
Appl. No.: 09/681,093
Filed: Jan. 2, 2001

(51) Int. Cl.
*H03M 13/00* (2006.01)
*H03M 13/29* (2006.01)
*H04L 1/00* (2006.01)

(52) U.S. Cl. .................................. 714/794; 714/755
(58) Field of Classification Search ............... None
See application file for complete search history.

(56) References Cited

U.S. PATENT DOCUMENTS 6,510,536 B1   1/2003   Crozier et al.
6,829,313 B1   12/2004  Xu

OTHER PUBLICATIONS

S. Crozier, K. Gracie, and A. Hunt, "Efficient Turbo Decoding Techniques," Proceedings of the 11th International Conference on Wireless Communications, Calgary, Alberta, Canada, pp. 187–195, Jul. 12–14, 1999.

T. Ngo and I. Verbauwhede, "Fixed Point Implementation for Turbo Codes," Final Report for 1998–99 Micro Project 98–162, http://www.ucop.edu/research/micro/98_99/98_162.pdf.

S. Pietrobon, "Implementation and Performance of a Turbo/Map Decoder," Int. J. Satellite Commun., vol. 16, pp. 23–46, Jan. –Feb. 1998.

J. Nikolic–Popovic, "Real–Time Implementation of cdma2000 Turbo Decoder on TMS320C6200," International Conferences on Signal Processing Applications and Technology, 1999.

L. R. Bahl, J. Cocke, F. Jelinek, and J. Raviv, "Optimal Decoding of Linear Codes for Minimizing Symbol Error Rate," IEEE Trans. Inform. Theory, vol. IT–20, pp. 284–287, Mar. 1974.

IEEE 100, "The Authoritative Dictionary of IEEE Standards Terms," Seventh Edition, New York, Institute of Electrical and Electronics Engineers, Inc. (New York, 2000).

ETSI TS 125 222 version 3.2.1 Specification, May 2005.

*Primary Examiner*—Woo H. Choi

(57) ABSTRACT

A Bandband Processor for Wireless Communications is presented. The invention encompasses several improved Turbo codes method to provide a more practical and simpler method for implementation a Turbo Codes Decoder in ASIC or DSP coding. (1) A plurality of pipelined pipelined Log-MAP decoders are used for iterative decoding of received data. (2) In a pipeline mode, Decoder A decodes data from the De-interleaver RAM memory while the Decoder B decodes data from the De-interleaver RAM memory at the same time. (3) Log-MAP decoders are simpler to implement in ASIC with only Adder circuits, and are low-power consumption. (4) Pipelined Log-MAP decoders method provide high speed data throughput, one output per clock cycle.

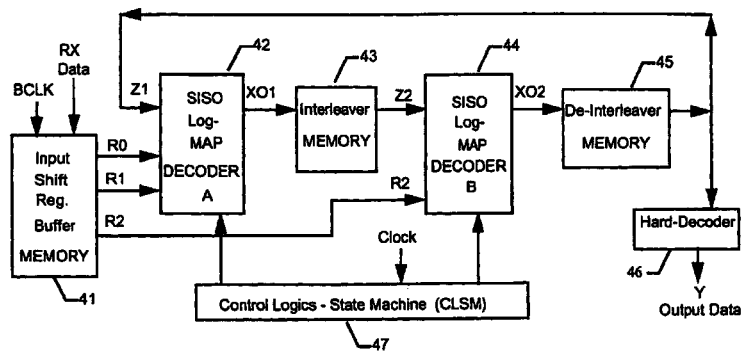

Turbo Codes Decoder System Block Diagram

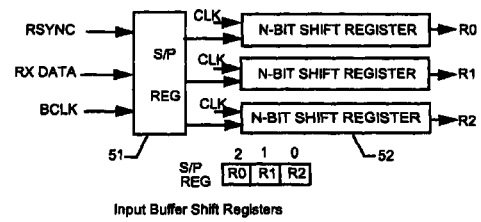

Input Buffer Shift Registers

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 5 and 8 are cancelled.

Claims 1–4, 6 and 7 are determined to be patentable as amended.

1. A baseband processor for iteratively processing a plurality sequences of received baseband digital signals, the baseband processor [subsystem] comprising:
   an input buffer comprising at least three shift registers, for receiving an input signal and generating first, second, and third shifted input signals;
   at least two soft decision decoders [are] *including first and second soft decision decoders* serially coupled in a circular circuit wherein each decoder processes soft decision from the preceding decoder output data in an iterative mode;
   at least one memory module that is electrically coupled to an output of a corresponding soft decision decoder, wherein the output of the memory module associated with [the] *a* last soft decision decoder is fed back as an input to the first soft decision decoder,
   wherein the output of the memory module associated with the first soft decision decoder is fed as an input to the second soft decision decoder, wherein the last soft decision decoder receives output of the memory module associated with the preceding soft decision decoder; *and*
   *wherein the first soft decision decoder further receives the first and second shifted input signals from the input buffer and the second soft decision decoder further receives the third shifted input signals from the input buffer.*

2. The baseband processor [subsystem] according to claim 1, wherein each decoder processes [at leat one baseband source signal input] *the shifted input signal or signals received from the input buffer* and an extrinsic information input coupled from the preceding memory module, wherein each decoder performs the maximum a posteriori decoding algorithm and stores the soft decision into its corresponding memory module.

3. The baseband processor [subsystem] according to claim 1, wherein each soft decision decoder uses a maximum a posteriori (MAP) probability algorithm, and/or a logarithm approximation algorithm.

4. The baseband processor [subsystem] according to claim 1, wherein each soft decision decoder implements concatenated convolutional codes.

6. A method of iteratively decoding a [plurally] *plurality* of sequences of received baseband signals, the method comprising:
   *providing an input buffer comprising at least three shift registers, for receiving an input signal and generating first, second, and third shifted input signals;*
   *providing first and second soft decision decoders serially coupled in a circular circuit, wherein each decoder processes soft decision from the preceding decoder output data, and wherein the first decoder further receives the first and second shifted input signals from the input buffer and the second decoder further receives the third shifted input signal from the input buffer;*
   *providing at least one memory module coupled to an output of each of the first and second soft decision decoders, wherein the output of the memory module associated with the second soft decision decoder is fed back as an input of the first soft decision decoder;*
   processing systematic information data and extrinsic information data using the maximum a posteriori (AP) probability algorithm, and/or logarithm approximation algorithm;
   generating soft decision based on the maximum a posteriori (MAP) probability algorithm, and/or logarithm approximation algorithm;
   [weighting] *weighing* and storing soft decision information into the corresponding memory module;
   performing, for a predetermined number of times, iterative decoding from the first to the last of multiple decoders, wherein an output from the last soft decision decoder is fed back as an input to the first soft decision decoder, then from the first to the second decoders, and propagate to the last decoder in a circular circuit.

7. The method according to claim 6, wherein the [the] soft-in soft-out (SISO) maximum a posteriori (MAP) probability algorithm and logarithm approximation algorithm calculates the alpha function probability A(k) of each state transition in forward [recurison] *recursion* and the beta function probability B(k) in backward recursion.

* * * * *